(12) United States Patent
Thoma

(10) Patent No.: US 11,190,137 B2
(45) Date of Patent: Nov. 30, 2021

(54) AMPLIFIER, CIRCUIT FOR TRIMMING A BIAS VOLTAGE, METHOD FOR AMPLIFYING AN INPUT SIGNAL AND METHOD FOR TRIMMING A BIAS VOLTAGE

(71) Applicant: Advantest Corporation, Tokyo (JP)

(72) Inventor: Anton Thoma, Munich (DE)

(73) Assignee: ADVANTEST CORPORATION, Tokyo (JP)

(*) Notice: Subject to any disclaimer, the term of this patent is extended or adjusted under 35 U.S.C. 154(b) by 0 days.

(21) Appl. No.: 16/659,659

(22) Filed: Oct. 22, 2019

(65) Prior Publication Data

US 2020/0052653 A1 Feb. 13, 2020

Related U.S. Application Data

(63) Continuation of application No. PCT/EP2017/060254, filed on Apr. 28, 2017.

(51) Int. Cl.
*H03F 3/04* (2006.01)
*H03F 1/02* (2006.01)
*H03F 1/30* (2006.01)
*H03F 3/21* (2006.01)

(52) U.S. Cl.
CPC .......... *H03F 1/0205* (2013.01); *H03F 1/301* (2013.01); *H03F 3/211* (2013.01); *H03F 2200/18* (2013.01); *H03F 2200/21* (2013.01); *H03F 2200/276* (2013.01); *H03F 2200/393* (2013.01)

(58) Field of Classification Search
CPC ........ H03F 1/0205; H03F 1/301; H03F 3/211; H03F 2200/18; H03F 2200/21; H03F 2200/276; H03F 2200/393; H03F 2203/30003; H03F 2203/30066; H03F 3/21; H03F 1/0261; H03F 1/308; H03F 3/085; H03F 3/3022; H03F 3/087; H03F 3/08; H03F 3/082; H03G 1/0047; H03G 3/3084
USPC .............. 250/59, 308, 214 A, 214 AG
See application file for complete search history.

(56) References Cited

U.S. PATENT DOCUMENTS

| | | | |
|---|---|---|---|
| 4,638,260 A * | 1/1987 | Hamley | H03F 3/3077 330/254 |
| 5,216,379 A | 6/1993 | Hamley | |
| 6,788,152 B2 * | 9/2004 | Nishizono | H03F 3/08 250/214 A |
| 6,858,830 B2 * | 2/2005 | Suzuki | G02B 6/4292 250/208.6 |
| 8,658,958 B2 * | 2/2014 | Lan | H01L 31/02019 250/214 A |
| 8,987,667 B2 * | 3/2015 | Lin | H04N 5/3745 250/338.1 |
| 9,176,007 B2 * | 11/2015 | Okada | H03F 3/08 |
| 2011/0156819 A1 | 6/2011 | Kim et al. | |
| 2014/0300413 A1 | 10/2014 | Hoyerby et al. | |

FOREIGN PATENT DOCUMENTS

GB 1234983 A 6/1971

* cited by examiner

*Primary Examiner* — Khanh V Nguyen

(57) ABSTRACT

An amplifier includes an amplifying device and a bias circuit for providing a bias voltage for the amplifying device. The bias circuit is configured to provide the bias voltage in dependence of an output signal of an optical coupling arrangement which provides for electrical isolation.

26 Claims, 7 Drawing Sheets

AMPLIFIER, CIRCUIT FOR TRIMMING A BIAS VOLTAGE, METHOD FOR AMPLIFYING AN INPUT SIGNAL AND METHOD FOR TRIMMING A BIAS VOLTAGE

CROSS-REFERENCES TO RELATED APPLICATION

This application is a continuation of copending International Application No. PCT/EP2017/060254, filed Apr. 28, 2017, which is incorporated herein by reference in its entirety.

Embodiments of the present invention relate to providing a bias voltage to an amplifying device.

BACKGROUND OF THE INVENTION

It has been found that power amplifiers involve a thorough control of the output stage to optimize signal fidelity versus a standby current consumption. It has been found that to ensure performance a cross current in output transistors may need to be adjusted well. It has been recognized that this adjustment involves exact process control or trimming (potentiometer) before the shipping of amplifier products. Some traditional designs use high voltage current mirrors to transfer a ground-related trim signal to a level of a power output stage.

In US 2014/0300413 A1 a power transistor gate driver is disclosed.

In US 2011/0156819 A1 a low-noise high efficiency bias generation circuit and method are described.

In light of the above mentioned conventional concepts, a desire exists for an improved concept for providing a bias voltage to an amplifying device.

SUMMARY

According to an embodiment, an amplifier may have: an amplifying device; and a bias circuit for providing a bias voltage for the amplifying device; wherein the bias circuit is configured to provide the bias voltage in dependence on an output signal of an optical coupling arrangement which provides for an electrical isolation.

According to another embodiment, a method for amplifying an input signal may have the steps of: providing a bias voltage for an amplifying device, wherein the bias voltage is provided in dependence of an output signal of an optical coupling arrangement which provides for an electric isolation.

According to another embodiment, a circuit for trimming a bias voltage may have: a controlled source, wherein the controlled source is controlled via an optical signal; and a first resistor; wherein the first resistor is circuited in parallel to the controlled source; and wherein the controlled source is configured to change a voltage drop across the first resistor, to thereby trim the bias voltage.

According to another embodiment, a method for trimming a bias voltage may have the steps of: controlling a controlled source via an optical signal, changing a voltage drop across a first resistor, circuited in parallel to the controlled source, to thereby trim the bias voltage.

Embodiments of the invention provide an amplifier comprising an amplifying device (e.g., a transistor) and a bias circuit for providing a bias voltage for the amplifying device. The bias circuit is configured to provide the bias voltage in dependence on an output signal (e.g., output current of an optocoupler or output current or output voltage of a solar cell) of an optical coupling arrangement (e.g., optocoupler or LED-solar cell arrangement) which provides for an electric isolation (e.g., such that the output signal of the optical coupling arrangement tunes or influences the bias voltage).

This embodiment is based on the idea the a provision of a bias voltage in dependence on an output signal of an optical coupling arrangement allows for a post-production tuning of a bias point while keeping a realization effort small and at the same time provides for an electrical decoupling between a trimming control and the amplifying device. The described embodiment eliminates a manual manufacturing trimming which may be useful for conventional amplifiers and therefore allows a low-cost production of power stages. For example, a cross current through the amplifying device (e.g., a transistor of a Class A amplifier) may be designed to be within a specified range for operation. For conventional amplifiers during manufacturing, it is useful to make a final adjustment of the bias voltage.

The described embodiment does not need a final adjustment as the bias voltage can still be adjusted based on the output signal of the optical coupling arrangement. Thereby, an expensive manufacturing process step or quality check can be avoided. Moreover, considering the aging of components, characteristics of electric or electronic components may change, leading to a drift of the bias voltage compared to a state after manufacturing. The described embodiment can adjust for the ageing as, based on an appropriate output signal of the optical coupling arrangement, the bias voltage may be readjusted.

In embodiments the bias circuit is configured to adjust the bias voltage based on the output signal of an optical coupling arrangement, when an operating point of the amplifying device deviates from a desired operating point. Adjusting the bias voltage based on a deviation from a desired operating point is useful to avoid signal distortions in the output signal of the amplifier. Moreover, when ensuring operation of the amplifying device at an operating point, energy may be conserved compared to an unadjusted operating point, e.g. causing a too large cross current to be flowing through a transistor.

In embodiments, the bias circuit comprises a first resistor circuit in parallel to the optical coupling arrangement, wherein the first resistor is coupled to a control terminal of the amplifying device. Further, the optical coupling arrangement is configured to provide a contribution to a voltage drop over the first resistor, wherein the voltage drop over the first resistor is configured to adjust the bias voltage. Using a voltage drop over the first resistor is a simple way of producing a desired voltage drop based on the knowledge of the resistor's resistance. For example, given the first resistor's resistance, the optical coupling arrangement may provide a current through the first resistor and thereby produce a contribution to the voltage drop over the first resistor, which is proportional to the resistance of the first resistor and proportional to the current.

In embodiments, the bias circuit comprises a regulator circuited in parallel to the first resistor and a second resistor (e.g., in parallel to a series connection of the first resistor and the second resistor), wherein the second resistor is circuited in series to the first resistor. Moreover, the regulator is configured to limit the bias voltage based on a voltage drop over the second resistor, to thereby limit a voltage drop over the first resistor, leading to an overall limited bias voltage.

Using the described regulator, a too-large bias voltage can be avoided and, thereby, damaging the amplifying device may also be avoided.

In embodiments the regulator is configured to limit (or regulate) the bias voltage (e.g., by diverting a current away) by offering a low impedance path in parallel to the first resistor and the second resistor through the regulator when the voltage drop over the second resistor exceeds a limit. Thereby, a voltage drop over the series circuit of the first resistor and the second resistor is reduced. The described embodiment may be used to limit (or regulate) a voltage drop over the first and the second resistor by diverting a current such that it runs through the regulator and not through the first and the second resistor. By not running through the first and the second resistor, a reduced voltage drop over the first and the second resistor is observed.

In embodiments, the regulator is configured to limit (or regulate) the bias voltage based on a voltage of a middle node of a voltage divider, wherein the voltage divider comprises the first resistor and the second resistor. The voltage drop over the voltage divider provides the bias voltage and the voltage drop over the voltage divider is influenced by the output signal of the optical coupling arrangement. Using the described voltage divider, a predefined voltage drop may be used over the second resistor to control the regulator, such that the regulator offers a low impedance path if a voltage drop over the second resistor is increasing (i.e. exceeds a threshold). Thereby, as the first resistor and the second resistor are circuited in series, a current which would be running through the first resistor and the second resistor is diverted through the regulator, reducing a voltage drop over the first and the second resistor.

In embodiments the optical coupling arrangement is configured to receive a control signal to provide an optical signal on the basis of the control signal and to provide the output signal of the optical coupling arrangement on the basis of the optical signal. Moreover, the output signal of the optical coupling arrangement is electrically isolated from the control signal. Using a control signal for the optical coupling arrangement enables flexible influence of the bias voltage based on the control signal. Further, through the electric isolation of the optical coupling arrangement, a circuit wherefrom the control signal may be originated from is electrically unaffected from the amplifier. Through the isolation, high voltages or high currents occurring in the amplifier damaging a circuit producing the control signal may be avoided.

In embodiments the optical coupling arrangement is configured to receive a pulse width modulated control signal. For example, using a pulse width modulated control signal may produce a pulsating light or optical signal which may be received, for example, by a solar cell or a photodiode of the optical coupling arrangement. Further, the optical signal may be converted to an electrical current and, in particular, through inertia to a substantially constant bias. Using pulses with varying width allows for adjustment of an average amount of current to be injected into the bias circuit.

In embodiments the amplifier is configured to adjust the control signal in dependence of a cross current of the amplifying device. Using a control signal adjusted or regulated in dependence of a cross current of the amplifying device can be helpful to bring a cross current of the amplifying device to an operation point of the amplifier.

In embodiments the amplifier is configured to adjust the control signal based on a measurement of a characteristic of an output signal of the amplifier. Using a characteristic of an output signal of the amplifier allows adjustment of the control signal such that an output signal of the amplifier is obtained with desired characteristics.

In embodiments the amplifier is configured to measure a characteristic of an output signal of the amplifier by stepping through various bias voltage settings. Using various bias voltage settings, an optimum characteristic of the output signal of the amplifier may be measured and, therefore, the control signal may be adjusted accordingly.

In embodiments, the amplifier comprises a signal input line configured to receive an input signal to be amplified, a positive supply voltage terminal and a negative supply voltage terminal. The positive supply voltage terminal and the negative supply voltage terminal are configured to provide supply voltages to the amplifier and the bias circuit is circuited between the signal input line and a control terminal of the amplifying device, to allow for an optically isolated adjustment of a voltage shift between the signal input line and the control terminal. The described embodiment can advantageously use the adjusted bias voltage to keep a voltage shift between the signal input line and the control terminal at a specified level. Further, when a signal is input at the signal input line, the bias circuit acts to keep a voltage shift between the signal input line and the control terminal substantially constant.

In embodiments, the amplifier comprises a first current source, circuited between the positive supply voltage terminal and the bias circuit, wherein the first current source is configured to provide a predefined current to the bias circuit. Using the described first current source, a current may be provided to the first resistor leading to a voltage drop over the first resistor which may be close to an optimum bias voltage. Thus, the bias circuit may only need to make a fine adjustment of the voltage drop over the first resistor, using the output signal of the optical coupling arrangement.

In embodiments, the amplifier comprises a second current source and a second bias circuit, wherein the second current source is circuited between the negative supply voltage terminal and the second bias circuit. The second current source is configured to provide a predefined current to the second bias circuit based on the voltage provided at the negative supply voltage terminal. Using the second current source and the second bias circuit, a second amplifier may be used in the amplifier such that positive and negative signal components may be amplified.

In embodiments, the amplifying device is configured to provide a positive output signal of the amplifier when a positive input signal is applied. Moreover, the output signal has an equal or higher current than the input signal. The described amplifier can be used to take a positive input signal with a small current to produce a positive output signal with a high current.

In embodiments the amplifier comprises a second amplifying device, wherein the second amplifying device is configured to provide a negative output signal of the amplifier when a negative input signal is applied to the amplifier. Moreover, the output signal has an equal or higher current than the input signal. The described embodiment can beneficially produce an amplified negative output signal based on a negative input signal.

Embodiments of the invention provide a method for amplifying an input signal. The method comprises, providing a bias voltage for an amplifying device, wherein the bias voltage is provided in dependence of an output signal of an optical coupling arrangement which provides for an electric isolation.

Embodiments according to the invention provide for a circuit for trimming a bias voltage. The circuit comprises a controlled source, wherein the controlled source is controlled via an optical signal. Further, the circuit comprises a first resistor, wherein the first resistor is circuited in parallel to the controlled source. Moreover, the controlled source is configured to change a voltage drop across the first resistor, to thereby trim the bias voltage.

The described circuit is advantageous as it allows for a trimming of a bias voltage, e.g., after manufacturing of a device needing a bias voltage (e.g., an amplifier, a transistor, etc.) while keeping an effort reasonably small and providing for an electrical decoupling. In devices where bias voltages may be used, large scale production may lead to inaccurate bias voltages and, therefore, a trimming may be useful or even recommendable for proper functionality. The described circuit can be used to adjust a voltage drop across the first resistor to influence the bias voltage. Further, an optical signal is used for controlling the controlled source and, thus, the change of a voltage drop across the first resistor. Based on the optical signal an electric isolation is provided which may shield circuits from the bias voltage. For example, the optical signal may be produced by an auxiliary circuit and this circuit may be isolated from the circuit for trimming a bias voltage based on the optical signal.

In embodiments, the first resistor is coupled to a control terminal of an amplifying device, in order to provide the trimmed bias voltage to the amplifying device. Coupling the control terminal of an amplifying device to the first resistor allows to provide (e.g., immediately) the bias voltage based on a voltage drop over the first resistor, wherein the voltage drop may be manually or automatically adjusted or tuned by adjusting the optical signal. The adjustment may be performed based on a deviation of an operating point of the amplifying device, e.g. a predefined cross current of the amplifying device.

In embodiments, the circuit is configured to trim the bias voltage based on a cross current through the amplifying device. Trimming the bias voltage based on a cross current enables keeping the power consumption of the amplifying device at a moderate level and avoiding distortions based on an incorrectly adjusted cross current of the amplifying device. Thereby, a glitch in an amplified signal, e.g. the output signal of the amplifier, can be avoided, e.g., such that positive and negative half waves may be reproduced correctly in the output signal of the amplifier.

In embodiments, the circuit is configured to trim the bias voltage based on a measurement of the characteristic of an output signal of the amplifying device. Using a measurement of the characteristic of an output signal of the amplifying device enables adjusting the bias voltage such that the amplifying device may be operated in an operation point. The operation point may have optimal properties for a usage of the amplifying device. For example: to provide an appropriate amplification of an input signal and a specified cross current, e.g., such that an appropriate amplification can be achieved and such that a power consumption is optimal while avoiding distortions in an output signal of the amplifier.

In embodiments, the circuit is configured to measure a characteristic of an output signal of the amplifying device by stepping through various bias trim settings (e.g., providing bias voltages with varying values to find an optimal value). By stepping through various bias trim settings an optimal characteristic of the output signal may be determined and based on this optimal characteristic of the output signal, a control signal is provided to the optical coupling arrangement leading to a desired voltage drop across the first resistor, such that the desired characteristic of the output signal is obtained.

In embodiments, the circuit for trimming the bias voltage is circuited between a signal input line for receiving an input signal to be amplified and a control terminal of an amplifying device. Moreover, a voltage between the signal input line and the control terminal serves to bias the amplifying device. The described circuit can beneficially use a changed voltage drop across the first resistor to adjust the voltage between the signal input line and the control terminal such that a desired bias voltage is obtained and retained even in adverse condition (by compensating bias voltage variations based on the output signal of the optical coupling arrangement).

In embodiments, the circuit comprises a regulator circuited in parallel to the first resistor and a second resistor (e.g., in parallel to a series connection of the first resistor and the second resistor), wherein the second resistor and the first resistor are circuited in series. Moreover, the regulator is configured to limit the bias voltage based on a voltage drop over the second resistor. As the first resistor and the second resistor are circuited in series, a common current flows through the first and the second resistor, thereby, based on a knowledge of a voltage drop over the second resistor, an overall voltage drop over the first and the second resistor may be deduced. Thus, limiting a maximum voltage at the second resistor leads to an overall voltage over the first and the second resistor, e.g., the bias voltage, which is also limited.

In embodiments, the regulator is configured to limit the bias voltage by offering a low impedance path in parallel to the first resistor and the second resistor through the regulator, when the voltage drop over the second resistor exceeds a limit. Thereby, the circuit provides a limited voltage drop over the first resistor and the second resistor, leading to an overall limited bias voltage. For example, when a current flowing usually through the first and the second resistor is offered a path in parallel with a lower resistance due to Ohm's Law, the current will take the path with lower resistance. Thereby, a voltage drop over the first and the second resistor can be reduced.

In embodiments, the regulator is configured to limit the bias voltage based on a middle node of a voltage divider, wherein the voltage divider comprises a first resistor and a second resistor. Moreover, a voltage drop over the voltage divider provides the bias voltage and the voltage divider is influenced by an output signal of the controlled source. Using a voltage divider with known resistance values of the first and the second resistor, provides knowledge over a voltage drop across the entire voltage divider based on a voltage at a middle node of the voltage divider. Thereby, using the voltage at a middle node of the voltage divider, an effective voltage regulation can be implemented using the regulator. Moreover, the voltage may additionally or alternatively be influenced by the output signal of the controlled source by reducing or increasing a voltage drop over the first or the second resistor.

In embodiments, the controlled source is configured to receive an optical signal on the basis of an electrical control signal and to provide an output signal of the controlled source on the basis of the optical control signal. Moreover, the output signal of the controlled source is electrically isolated from the electrical control signal. Using the described circuit a beneficial isolation of the electrical control signal from, e.g., the bias voltage can be achieved. Moreover, the electrical control signal may be produced in a low voltage circuit while the circuit for trimming the bias voltage may, for example, be integrated in a high voltage environment (e.g., an amplifier). Therefore, electrical isolation may be an important factor in the described application. The electrical control signal may, for example, excite a light emitting diode (LED) and the controlled source may be a photodiode or a solar cell which receives the optical control signal.

In embodiments, the controlled source is configured to receive an optical control signal which is based on a pulse width a modulated electric control signal. Using a pulse width modulation enables simple adjustment of a current of the controlled source based on the width of the pulses of the pulse-width-modulated electrical control signal.

Embodiments provide for a method for trimming a bias voltage. A method comprises controlling a control source via an optical signal. Further, changing a voltage drop across a first resistor, circuited in parallel to the controlled source. Moreover, the method comprises trimming the bias voltage based on the voltage drop across the first resistor.

The methods can be supplemented by all features and functionalities which are herein-described with respect to apparatuses, either individually or in combination.

BRIEF DESCRIPTION OF THE DRAWINGS

Embodiments of the present invention will be detailed subsequently referring to the appended drawings, in which.

DETAILED DESCRIPTION OF THE INVENTION

Figure 1:
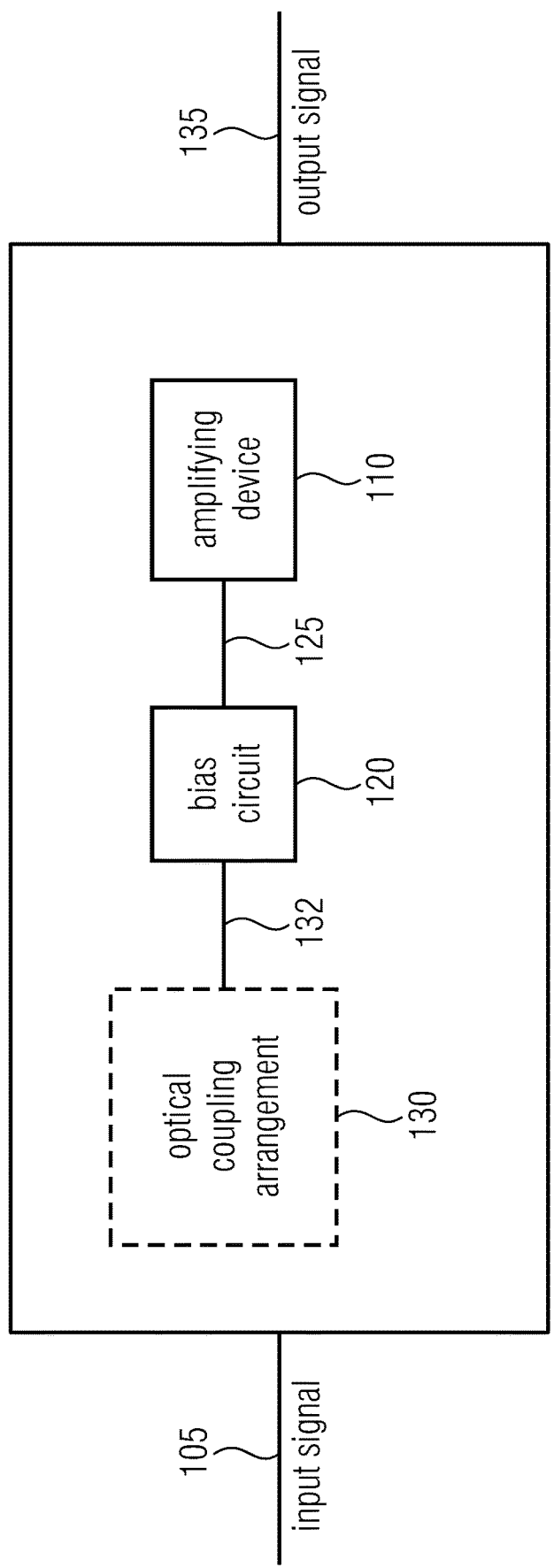
FIG. 1 shows a block diagram of an amplifier according to embodiments of the invention.

FIG. 1 shows a block diagram of an amplifier 100 according to embodiments of the invention. The amplifier 100 comprises an amplifying device 110, a bias circuit 120 and an optical coupling arrangement 130 (which may be a part of the bias circuit 120 or which may be an external component). Moreover, the amplifier 100 takes as input an input signal 105 and provides an amplified input signal as the output signal 135.

The bias circuit 120 is configured to provide a bias voltage for the amplifying device 110, wherein the bias circuit 120 is configured to provide the bias voltage 125 in dependence on an output signal 132 of the optical coupling arrangement 130 which provides for an electrical isolation. Further, the amplifying device 110 may be configured to work at an operation point. Therefore, a bias voltage 125 is provided to the amplifying device 110 by the bias circuit 120. As the bias voltage 125 may deviate from a desired voltage, e.g., which may be used for keeping the amplifying device 110 at the operation point, the bias circuit 120 is provided by the optical coupling arrangement with an appropriate output signal 132 of the optical coupling arrangement 130. Moreover, the output signal 132 of the optical coupling arrangement is configured to provide or contribute to the bias voltage 125, e.g. such that a deviation of the bias voltage 125 (from a desired bias voltage) is reduced or compensated.

The described amplifier 100 can beneficially provide a bias voltage 125 based on the output signal 132 of the optical coupling arrangement such that the bias voltage 125 may, for example, be adjusted. For example, in large scale production of amplifiers, a bias voltage of an amplifier after production may not correspond to a desired bias voltage and, therefore, tedious quality control may be recommended for conventional amplifiers to obtain high quality amplifiers. The described amplifier 100, however, prevents the need for this tedious quality control as the bias voltage 125 may be changed based on the output signal 132 of the optical coupling arrangement after manufacturing of the amplifier 100. Moreover, a signal used to control the optical coupling arrangement 130 is decoupled from the output signal 132 of the optical coupling arrangement, i.e., electrically isolated. Thereby, a control signal to the optical coupling arrangement may be provided from a circuit which is unaffected from voltages occurring in the amplifier 100.

In the following aspects of embodiments of the invention are described which can be used by themselves or in combination with any of the embodiments described herein. In other words, the embodiments described herein ca be supplemented by any of the features and functionalities described in the following, either individually or in combination.

Figure 2:
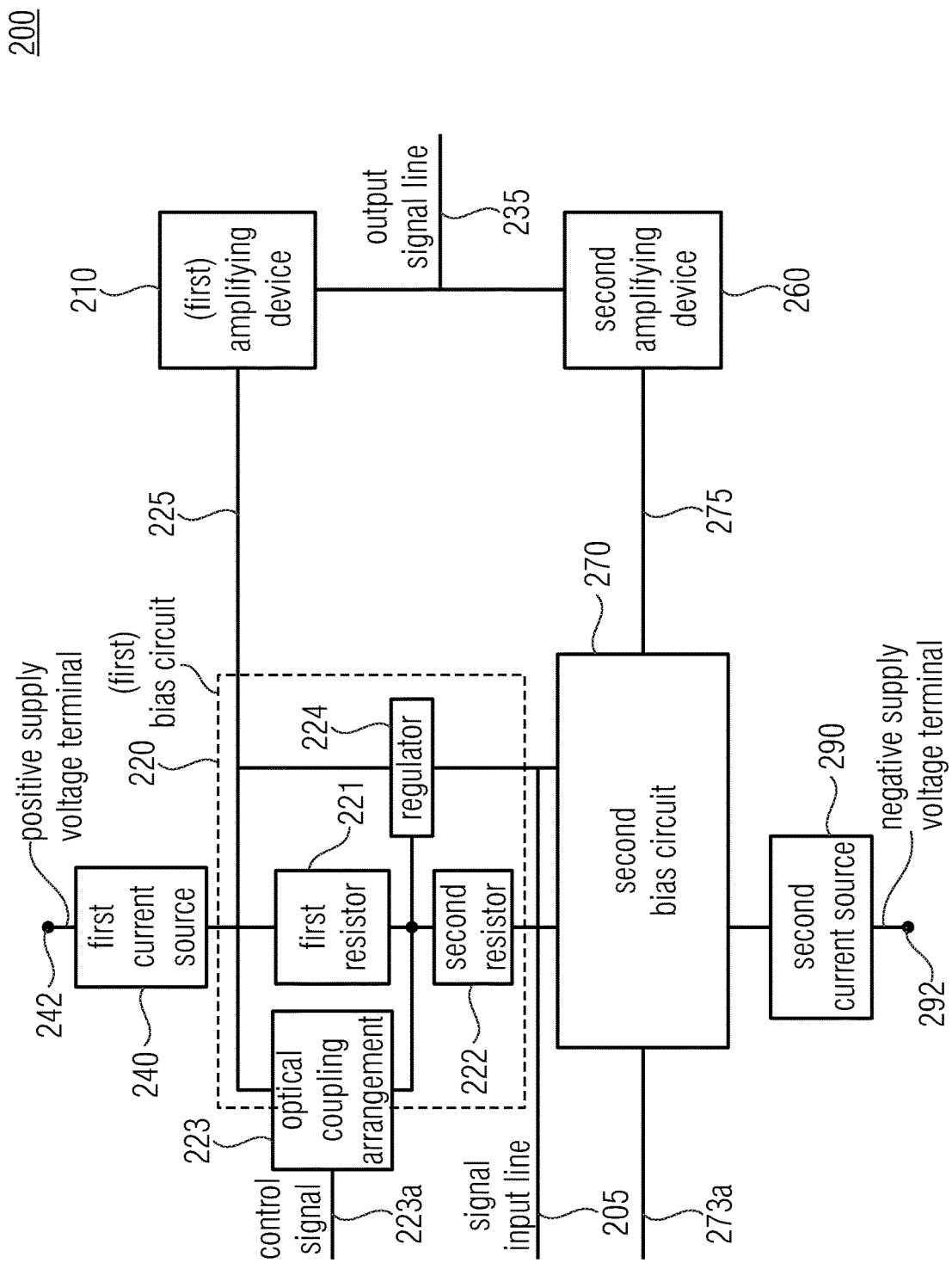
FIG. 2 shows a block diagram of an amplifier according to embodiments of the invention.

FIG. 2 shows a block diagram of an amplifier 200 according to embodiments of the invention. Amplifier 200 comprises an (first) amplifying device 210, a second amplifying device 260, a (first) bias circuit 220, a second bias circuit 270, a first current source 240, and a second current source 290. Moreover, the amplifier 200 comprises a signal input line 205, a signal output line 235, a positive supply voltage terminal 242 and negative supply voltage terminal, 292. The positive supply voltage terminal 242 and the negative supply voltage terminal 292 are configured to provide a positive supply voltage and a negative supply voltage to the amplifier 200, respectively.

The bias circuit 220 comprises a first resistor 221, a second resistor 222, an optical coupling arrangement 223, and a regulator 224. Moreover, the bias circuit 220 is circuited between the signal input line 205 and a control terminal of the amplifying device 210 (e.g. a gate or base electrode of a transistor). Furthermore, the second bias circuit 270 is circuited between the signal input line 205 and a control terminal of the second amplifying device 260. The bias circuit 220 provides a (first) bias voltage on a control line 225 to the amplifying device 210, and the second bias circuit 270 provides a second bias voltage on a second control line 275 to the second amplifying device 260.

Dependent on a current provided by the first current source 240 to the bias circuit 220, a voltage drop over the first resistor 221 and the second resistor 222, which are circuited in series, may provide a basis for the bias voltage on the control line 225, provided to the amplifying device 210. However, as the first current source 240 may provide an inexact current or non-accurate current to the bias circuit 220, the voltage drop over the first resistor 221 and the second resistor 222 may deviate from a desired bias voltage. Therefore, the optical coupling arrangement 223 may change the voltage drop over the first resistor 221 such that the bias voltage on the control line 225 may be brought closer to a desired voltage. The optical coupling arrangement 223 takes as input a control signal 223a, which may be electric, and is converted to an optical signal in the optical coupling arrangement. Based on the optical signal, the optical coupling arrangement 223 provides an output current which provides a (positive or negative) contribution to the voltage drop over the first resistor 221, thereby, influencing the bias voltage on the control line 225. In the described manner, the optical coupling arrangement 223 allows for a control of the bias voltage through the control signal 223a. Moreover, the control signal 223a is electrically isolated from the bias voltage 225 based on an optical transmission in the optical coupling arrangement 223.

The second bias circuit 270 may act according to the bias circuit 220, based on a second control signal 273a and a current provided by the second current source 290. Moreover, the first current source 240 and the second current source 290 provide defined currents to the amplifier 200 based on voltages of the positive supply voltage terminal 242 and the negative supply voltage terminal 292. Furthermore, an input signal fed into the amplifier through the signal input line 205 will be output amplified as the output signal of the amplifier 235. For example, the signal input line 205 may have (comparatively) high impedance, and therefore a current of a signal input may be (comparatively) small. An output signal of the amplifier 200, provided via the output signal line 235 may, therefore, provide an output signal with a higher current than an input signal.

Figure 3:
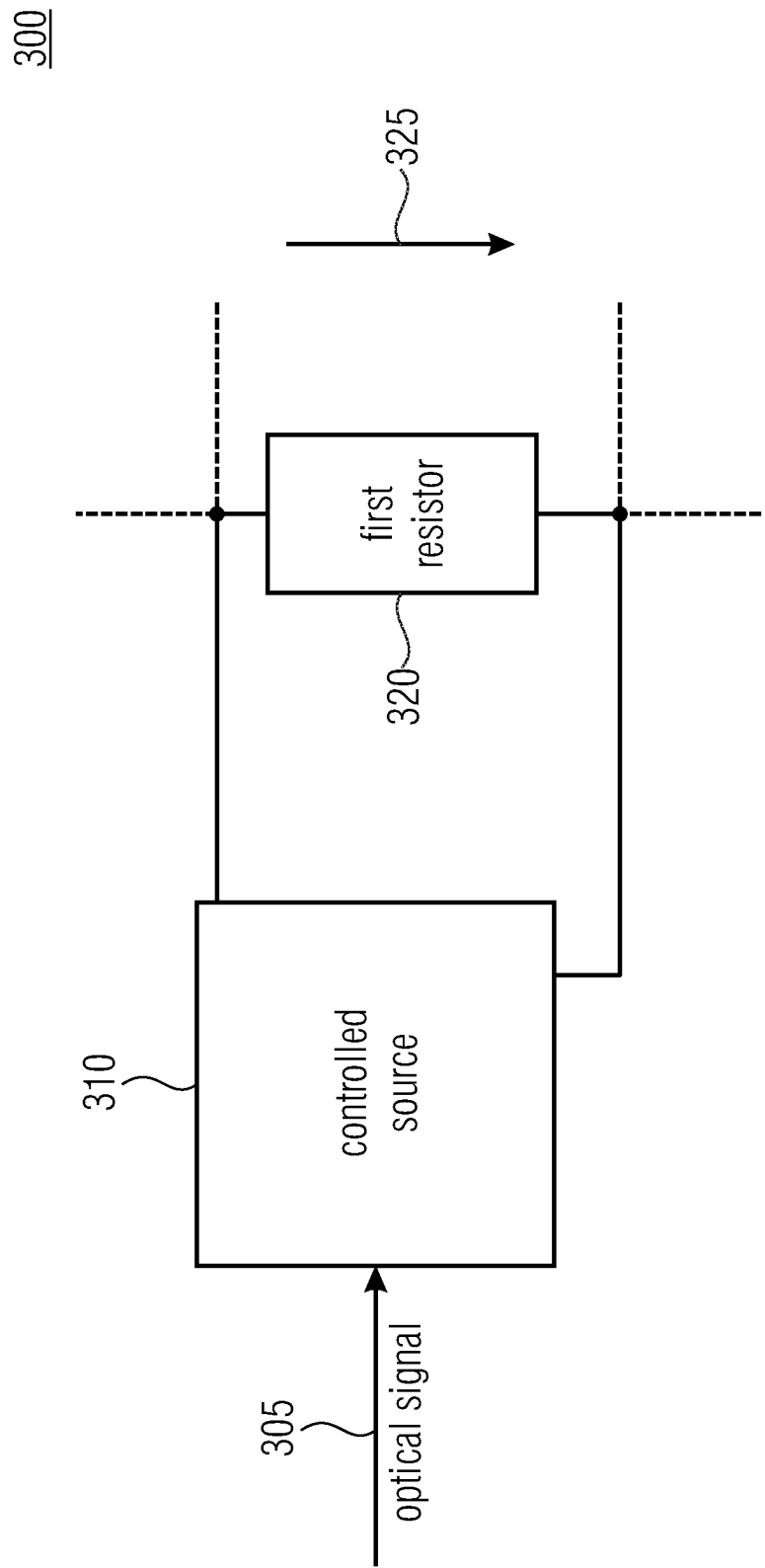
FIG. 3 shows a schematic of a circuit for trimming a bias voltage according to embodiments of the invention.

FIG. 3 shows a schematic of a circuit 300 for trimming a bias voltage according to embodiments of the invention. The circuit 300 comprises a controlled source 310 and a first resistor 320. The controlled source 310 is controlled via an optical signal 305 and the first resistor 320 is circuited in parallel to the controlled source 310. Moreover, the controlled source 310 is configured to change a voltage drop 325 across the first resistor 320, to thereby trim the bias voltage.

The controlled source 310 takes as input an optical signal 305 to provide a current through the first resistor 320. The current provided to the first resistor 320 causes a changed voltage drop 325 over the first resistor 320. Based on the voltage drop 325 over the first resistor 320, a (positive or negative) contribution to the bias voltage is provided, for example, a bias voltage for an amplifying device (e.g., a transistor). Moreover, based on the optical signal 305, the voltage drop 325 can be trimmed, i.e., adjusted, such that a contribution to a bias voltage is provided which may serve to bring an amplifying device, using the bias voltage, closer to a desired operating point of the amplifying device. Moreover, through the optical signal 305, an isolation of the circuit 300 from a circuit producing the optical signal 305 is provided, which may be beneficial to avoid damaging a circuit producing the optical signal 305 from high voltages or currents in a circuit in which the circuit 300 may be integrated.

Figure 4:
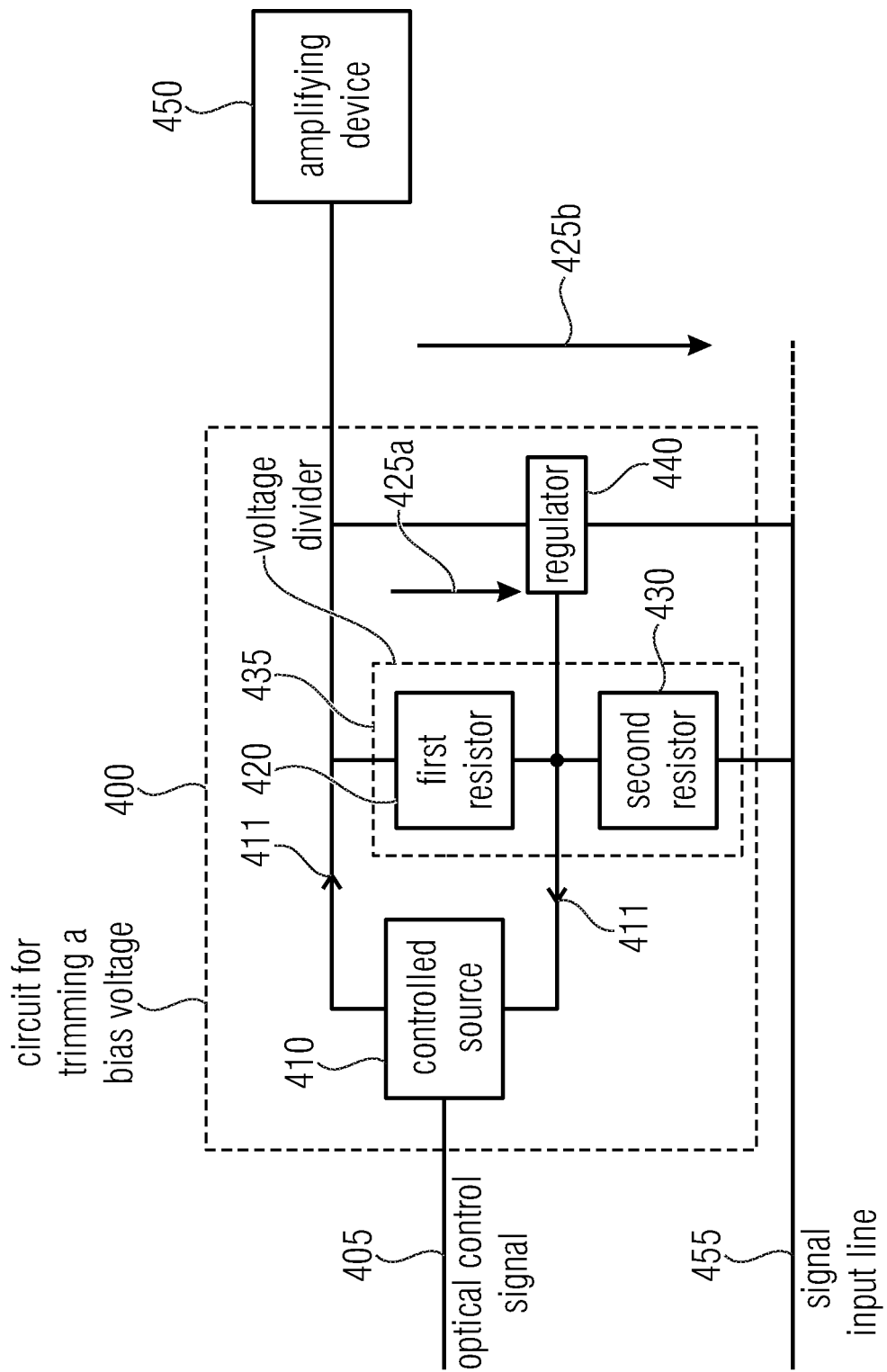
FIG. 4 shows a schematic of a circuit for trimming a bias voltage according to embodiments of the invention.

FIG. 4 shows a schematic of a circuit 400 for trimming a bias voltage according to embodiments of the invention. The circuit 400 comprises a controlled source 410, a first resistor 420, a second resistor 430 and regulator 440. The first resistor 410 and the second resistor 420 can be grouped into a voltage divider 435 (i.e., may be circuited in series).

Furthermore, the circuit 400 is circuited between a signal input line 455 and an amplifying device 450. In particular, the circuit 400 provides a bias voltage 425b to a control terminal of the amplifying device 450. In other words, the circuit 400 serves to bias the amplifying device 450 from a voltage of the signal input line 455. Therefore, a substantially constant voltage shift between the signal input line 455 and the amplifying device 450 (or a control terminal thereof) is obtained. Moreover, in the circuit 400 the bias voltage 425b is influenced by a voltage drop 425a over the first resistor 420 (e.g., the voltage drop 425a is part of the voltage drop 425b). The voltage drop 425a is thus influenced by a current 411 provided by the controlled source 410 through the first resistor 420. Further, the controlled source 410 takes for control of the current 411 provided to the first resistor 420, an optical control signal 405 as input. The optical control signal 405 defines the amount of the current 411 provided to the first resistor 420. Thereby, the voltage drop 425a over the first resistor 410 of the circuit 400 can be controlled. Moreover, the bias voltage 425b may comprise the voltage drop 425a and a voltage drop over the second resistor 430. Thereby the voltage drop 425a may directly influence the bias voltage 425b.

Furthermore, the regulator 440 of the circuit 400 is configured to limit the bias voltage 425b based on a voltage drop over the second resistor 430. In other words, the regulator 440 avoids excessive bias voltages 425b which may be harmful, e.g., to the amplifying device 450 or the circuit 400. The regulator 440 may operate by rerouting or diverting a current, which would usually flow through the voltage divider 435 (e.g., comprising the first resistor 420 and the second resistor 430), through the regulator 440. As the current is diverted from the voltage divider 435, a changed voltage drop over the voltage divider 435 is obtained reducing or limiting the bias voltage 425b. In embodiments, a voltage over the voltage divider 435 may directly serve as the bias voltage 425b. For example, a voltage drop over the second resistor 430 may be regulated to take a predetermined value by the regulator. Thus, the bias voltage may, for example, be the sum of an approximately fixed voltage drop over the second resistor 430 and an available voltage drop, adjusted by the optical coupling element, over the first resistor.

Figure 5:
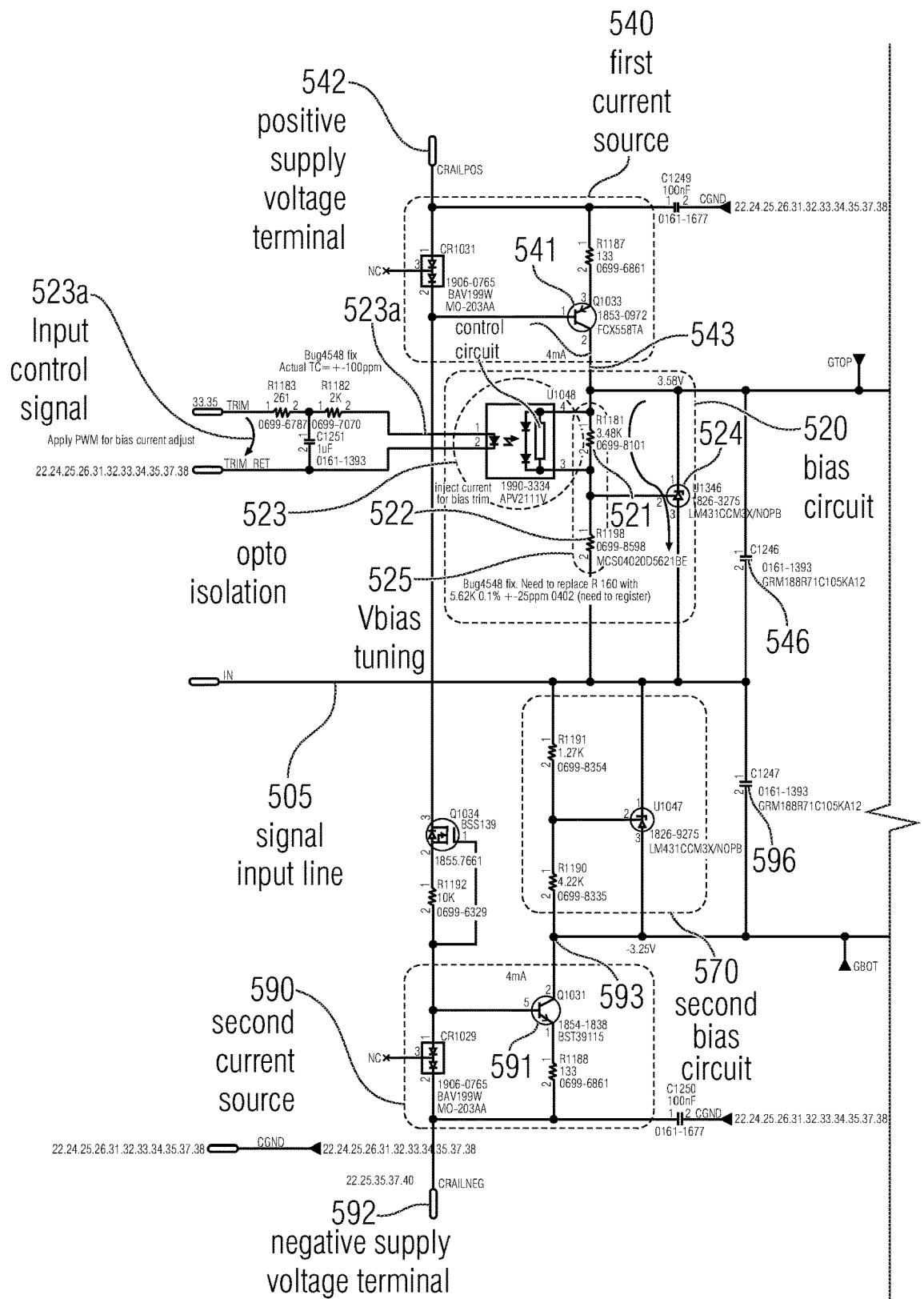
FIG. 5 shows a detailed schematic of an amplifier according to embodiments of the invention.
Figure 5:
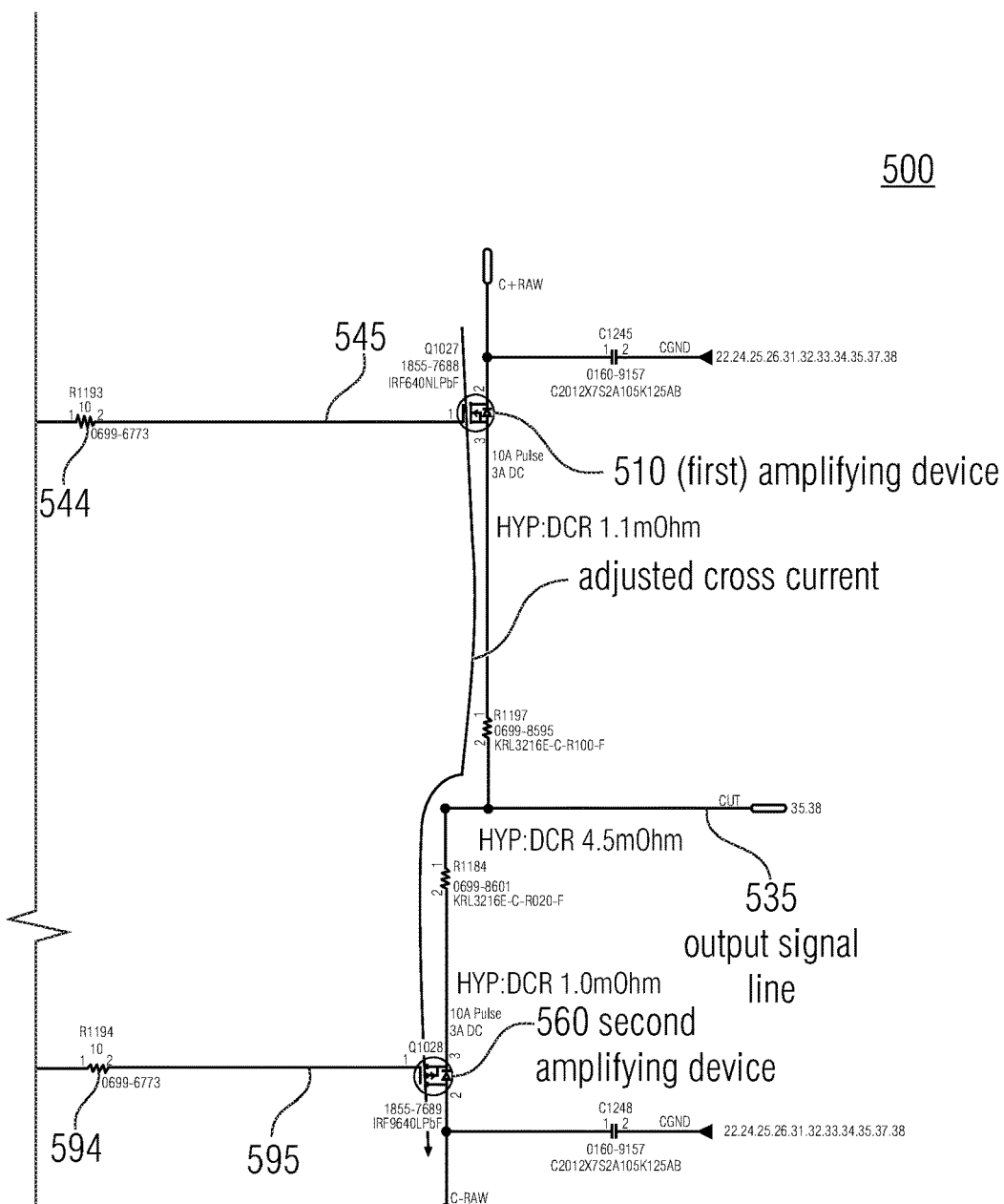

FIG. 5 shows a detailed schematic of an amplifier 500 according to embodiments of the invention. The amplifier 500 comprises an (first) amplifying device 510, a second amplifying device 560, a (first) bias circuit 520, a second bias circuit 570, a first current source 540 and a second current source 590.

The (first) bias circuit 520 is circuited between a control terminal of the first amplifying device 510 and a signal input line 505 and the (first) bias circuit 520 and the first current source 540 are coupled to a first control node 543, which is coupled to a control terminal (e.g. gate terminal) of the first amplifying device 510 via an (optional) resistor and the first control line 545. The second bias circuit 570 is circuited between the signal input line 505 and a control terminal of the second amplifying device 560 and the second bias circuit 570 and the second current source 590 are coupled to a second control node 593, which is coupled to a control terminal (e.g. gate terminal) of the second amplifying device 560 via an (optional) resistor 594 and the second control line 595. Furthermore, the first current source 540 is circuited between a positive supply voltage terminal 542 and the first control node 543. The second current source 590 is circuited between a negative supply voltage terminal 592 and the second control node 593. Moreover, a first capacitor 546 is circuited between the signal input line 505 and the first control node 543 and a second capacitor 596 is circuited between the signal input line 505 and the second control node 593. Further, the first capacitor 546 is circuited in parallel to the first bias circuit 520 and the second capacitor 596 is circuited in parallel to the second bias circuit 570.

The first current source 540 and the second current source 590 each comprise a transistor, i.e., bipolar junction transistor (BJT) 541 (PNP type) and bipolar junction transistor 591 (NPN type), wherein the transistors 541 and 591 are adjusted to provide predefined currents to the first control node 543 and the second control node 593. In a steady state the current provided by the first current source 540 flows through the first bias circuit 520 and the current provided by the second current source 590 flows through the second bias circuit 570. The adjustment of the transistors is performed on the basis of two diodes and a resistor, circuited between a control terminal (e.g. a base terminal) of the transistors 541 and 591 and a source terminal of the transistors 541 and 591. In other words, the two diodes provide each a voltage drop of about 0.7V which is equal to a sum of a voltage drop over the control terminal and the source terminal and a voltage drop over the resistor, thereby, adjusting a current through the resistors 541 and 591. The first current source 540 and the second current source 590 each provide substantially identical currents with inverted polarity, such that a current flowing through the first bias circuit 520 is identical to a current flowing through the second bias circuit 570.

The (first) amplifying device 510 is an n-channel field effect transistor (e.g. an n-channel MOSFET (Metal-Oxide-Semiconductor Field Effect transistor)) and the second amplifying device 560 is a p-channel field effect transistor (e.g. a p-channel MOSFET). Furthermore, the (first) bias circuit 520 comprises an optocoupler (optical coupling arrangement) 523 which provides for an opto isolation, a first resistor 521, a second resistor 522, and a regulator 524. The regulator 524 may also be referred to as an adjustable Zener diode or an adjustable Zener shunt regulator. The optocoupler 523 comprises an optional control circuit to actively control a current provided to the first resistor 521. The first resistor 521 and the second resistor 522 are circuited in series and form the voltage divider 525, which is circuited between the signal input line 505 and the first control line 545. A first terminal of the first resistor 521 is coupled to the first control node 543, a second terminal of the first resistor 521 is coupled to a first terminal of the second resistor 522 and a second terminal of the second resistor 522 is coupled to the signal input line 505. Further, the optocoupler is circuited in parallel to the first resistor 521, wherein a positive terminal of the optocoupler 523 is coupled to the first terminal of the first resistor 521 and a negative terminal of the optocoupler 523 is coupled to the second terminal of the first resistor 521. The regulator 524 comprises a cathode, an anode and a reference node. The reference node is coupled to the middle node of the voltage divider 525, the anode is couple to the signal input line 505 and the cathode is coupled to the first control node 543.

Moreover, the bias circuit 520 is configured to provide a bias voltage between the signal input line 505 and the first control line 525. Furthermore, the bias circuit 520 is configured to adjust or tune the bias voltage based on an input control signal 523a of the optical coupling arrangement 523. Based on an output signal of the optical coupling arrangement 523 a current is provided to the first resistor 521 to provide a (positive or negative) contribution to a voltage drop over the first resistor 521. The optocoupler 523 is a photovoltaic MOSFET driver, which may, for example, act as an active element and is capable to provide a short circuit output current and an open circuit output voltage in the presence of an optical excitation. For example, the optocoupler 523 and the first resistor 521 may be designed such that an output current of the optocoupler 523, which is provided in the presence of an optical excitation, causes a voltage (or voltage variation) over the first resistor 521 of at least 5 mV, to thereby allow for a variation of an operating point. When the reference voltage obtained by the regulator 524 is exceeding a limit, the regulator 524 offers a low impedance path in parallel to the voltage divider and therefore may reduce a voltage drop over the voltage divider 525, through regulation of the voltage drop over the second resistor 522. Thereby, excessive bias voltages can be avoided which could potentially harm the amplifying devices 510 and 560. Thus the voltage drop across the second resistor 522 is kept substantially constant, and a change of the voltage across the first resistor 521, which is caused by the optocoupler 523, results in a change of the operating point.

Generally, the first capacitor 546 is circuited between the signal input line 505 and the first control line 545 such that a substantially constant voltage difference (which can nevertheless be adjusted by the optocoupler 523) is retained between the signal input line 505 and the first control line 545. Moreover, the substantial constant voltage serves to bias the first amplifying device 510. Further, the second capacitor 596 is circuited between the signal input line 505 and the second control line 595 such that a substantially constant voltage difference is retained between the signal input line 505 and the second control line 595. Moreover, the substantial constant voltage serves to bias the second amplifying device 560. Furthermore, the first capacitor 546 may serve to smooth a change of the voltage drop caused by the bias circuit 520. Further, the substantially constant voltage differences are retained, when an input signal on the signal input line 505 varies the voltage on the signal input line 505.

The second bias circuit 570 comprises elements which are similar to elements of the (first) bias circuit 520 but is not necessarily equipped with an optocoupler such as the optical coupling arrangement 523. In embodiments, however, the second bias circuit 570 may also comprise an optical coupling arrangement (e.g. optocoupler 523).

Figure 6:
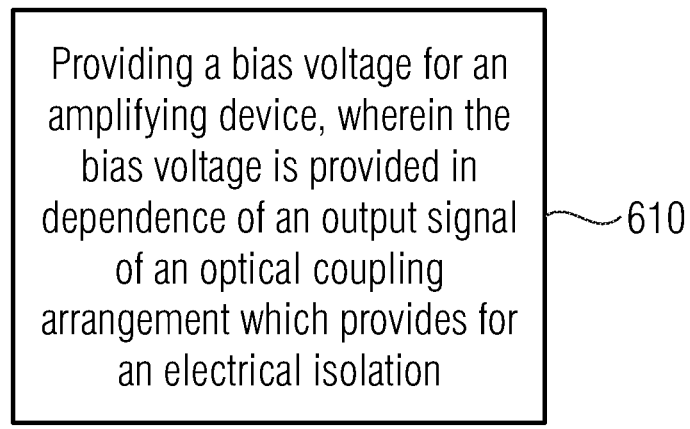
FIG. 6 shows a flow chart of a method for amplifying an input signal according to embodiments of the invention.

FIG. 6 shows a flow chart of a method 600 for amplifying an input signal according to embodiments of the invention. A method 600 comprises providing 610 a bias voltage for an amplifying device, wherein the bias voltage is provided in dependence of an output signal of an optical coupling arrangement which provides for an electrical isolation.

Figure 7:
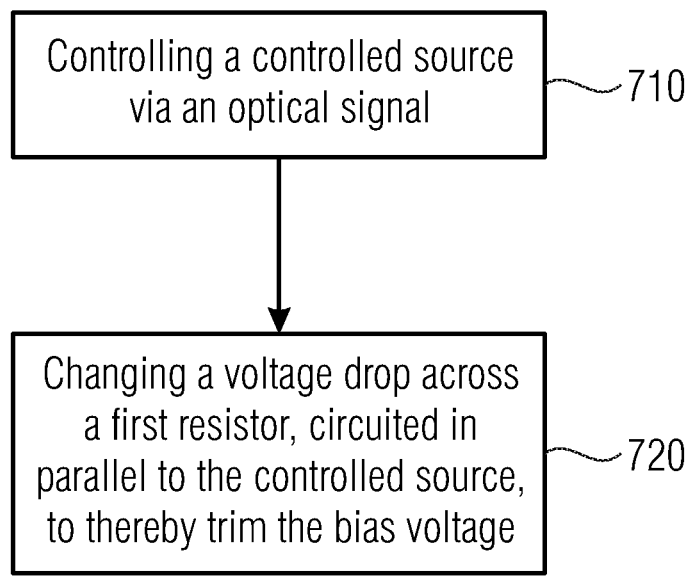
FIG. 7 shows a flow chart of a method for trimming a bias voltage according to embodiments of the invention.

FIG. 7 shows a flow chart of a method 700 for trimming a bias voltage according to embodiments of the invention. The method 700 comprises controlling 710 a controlled source via an optical signal. Further, the method 700 comprise changing 720 a voltage drop across a first resistor, circuited in parallel to the controlled source, to thereby trim the bias voltage.

FURTHER ASPECTS

In the following, some further aspects of the invention will be described which can be used individually or in combination with any of the other embodiments described herein.

It has been found that, power amplifiers involve performing thorough control of the output stage to optimize signal fidelity versus standby current consumption. To ensure performance the cross current in the output transistors needs to be well adjusted. This involves exact process control or trimming (potentiometer) before shipment of amplifier product. Some traditional designs use high voltage current mirrors to transfer the ground related trim signal to the level of the power output stage.

Apparatuses and methods according to embodiments of the invention allow trimming a performance of a power stage in application and may not require trim steps during product manufacturing or sophisticated process control. For high voltage amplifiers also the circuit size is reduced.

Advantages of embodiments compared to conventional concepts are:

Eliminating a manual manufacturing trimming of power stages.

Enables low cost production of power stages.

Allows for isolated design which enables a reduced component size for high voltage amplifiers.

In embodiments, a cross current of a power amplifier output stage is controlled by a voltage difference of the transistor control voltage (Class A output stage): bias voltage.

In embodiments, the output current of a solar cell is used to tune the bias voltage of output FETs. Also an isolating opto-coupler in linear operation may be used to influence the bias voltage.

In embodiments, an opto-isolated input control voltage or current is used to modify the bias voltage independence of the amplifier output voltage. The bias voltage controls the cross current through output transistors.

In embodiments, a control signal can be created by a DAC (digital to analog converter) or filtered PWM (pulse width modulated) signal from low voltage based circuitry.

In embodiments, by running AC performance tests at different bias settings, an optimum power stage performance can be determined at any time (also after product shipment).

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. An amplifier, comprising:
an amplifying device;
an optical coupling arrangement operable to generate an output signal and to provide an electrical isolation; and
a bias circuit for providing a bias voltage for the amplifying device based on the output signal,
wherein the bias circuit is configured to adjust the bias voltage based on the output signal of the optical coupling arrangement when an operating point of the amplifying device deviates from a desired operating point during operation of the amplifying device.

2. The amplifier according to claim 1, wherein the bias circuit comprises a first resistor coupled in parallel to the optical coupling arrangement, wherein the amplifying device comprises a control terminal, wherein the first resistor is coupled to the control terminal of the amplifying device, and wherein the optical coupling arrangement is configured to provide a contribution to a voltage drop across the first resistor, wherein the voltage drop across the first resistor is configured to adjust the bias voltage.

3. The amplifier according to claim 2 wherein the bias circuit comprises a regulator coupled in parallel to a resistor arrangement comprising the first resistor and a second resistor, wherein the second resistor is coupled in series to the first resistor, and wherein the regulator is configured to limit the bias voltage based on a second voltage drop across the second resistor.

4. The amplifier according to claim 3, wherein the regulator is configured to limit the bias voltage by offering a low impedance path in parallel to the resistor arrangement comprising the first resistor and the second resistor through the regulator when the second voltage drop across the second resistor exceeds a limit.

5. The amplifier according to claim 3, wherein the regulator is configured to limit the bias voltage based on a voltage at a middle node of the resistor arrangement that operates as a voltage divider, wherein the voltage divider comprises the first resistor and the second resistor, wherein a divider based voltage drop across the voltage divider provides the bias voltage, and wherein the divider-based voltage drop across the voltage divider is influenced by the output signal of the optical coupling arrangement.

6. The amplifier according to claim 1, wherein the optical coupling arrangement is configured to receive a control signal to provide an optical signal based on the control signal and to provide the output signal of the optical coupling arrangement based on the optical signal, wherein the output signal of the optical coupling arrangement is electrically isolated from the control signal.

7. The amplifier according to claim 6, wherein the optical coupling arrangement is configured to receive a pulse width-modulated control signal.

8. The amplifier according to claim 6, wherein the amplifier is configured to adjust the control signal based on a cross current of the amplifying device.

9. The amplifier according to claim 6, wherein the amplifier is configured to adjust the control signal based on a measurement of a characteristic of an amplifier output signal of the amplifier.

10. The amplifier according to claim 9, wherein the amplifier is configured to measure the characteristic of the amplifier output signal of the amplifier by stepping through various bias voltage settings.

11. The amplifier according to claim 1, wherein the amplifier further comprises:
a signal input line configured to receive an input signal to be amplified;
a positive supply voltage terminal; and
a negative supply voltage terminal, wherein the positive supply voltage terminal and the negative supply voltage terminal are configured to provide supply voltages to the amplifier, wherein the amplifying device comprises a control terminal, wherein the bias circuit is coupled between the signal input line and the control terminal of the amplifying device to allow for an optically isolated adjustment of a voltage shift between the signal input line and the control terminal.

12. The amplifier according to claim 11, wherein the amplifier further comprises a first current source coupled between the positive supply voltage terminal and the bias circuit, wherein the first current source is configured to provide a predefined current to the bias circuit.

13. The amplifier according to claim 11, wherein the amplifier further comprises a second current source and a second bias circuit, wherein the second current source is coupled between the negative supply voltage terminal and the second bias circuit, wherein the second current source is configured to provide a predefined current to the second bias circuit based on a voltage provided by the negative supply voltage terminal.

14. The amplifier according to claim 1, wherein the amplifying device is configured to provide a positive output signal of the amplifier when a positive input signal is applied, wherein the positive output signal exhibits an equal or higher current relative to the positive input signal.

15. The amplifier according to claim 1, wherein the amplifier further comprises a second amplifying device, wherein the second amplifying device is configured to provide a negative output signal of the amplifier when a negative input signal is applied to the amplifier, wherein the negative output signal exhibits an equal or higher current relative to the negative input signal.

16. A method for amplifying an input signal comprising:
providing an optical coupling arrangement operable to provide an electric isolation;
outputting an output signal from the optical coupling arrangement;
providing a bias voltage for an amplifying device based on the output signal; and
adjusting the bias voltage based on the output signal from the optical coupling arrangement when an operating point of the amplifying device deviates from a desired operating point during operation of the amplifying device.

17. A circuit for trimming a bias voltage, comprising:
a controlled source, wherein the controlled source is controlled via an optical control signal; and
a first resistor coupled to a control terminal of an amplifying device to provide the trimmed bias voltage to the amplifying device,
wherein the first resistor is coupled in parallel to the controlled source, and
wherein the controlled source is configured to change a voltage drop across the first resistor to trim the bias voltage based on a measurement of a characteristic of an output signal of the amplifying device during operation of the amplifying device.

18. The circuit according to claim 17, wherein the circuit is configured to measure the characteristic of the output signal of the amplifying device by stepping through various bias trim settings.

19. The circuit according to claim 17, wherein the circuit is configured to trim the bias voltage based on a cross current through the amplifying device.

20. The circuit according to claim 17, wherein the circuit further comprises a signal input line, wherein the circuit for trimming the bias voltage is coupled between the signal input line for receiving an input signal to be amplified and a control terminal of the amplifying device, wherein a voltage between the signal input line and the control terminal serves to bias the amplifying device.

21. The circuit according to claim 17, wherein the circuit further comprises a regulator coupled in parallel to a resistor arrangement comprising the first resistor and a second resistor, wherein the second resistor and the first resistor are coupled in series, and wherein the regulator is configured to limit the bias voltage based on a second voltage drop across the second resistor.

22. The circuit according to claim 21, wherein the regulator is configured to limit the bias voltage by offering a low impedance path in parallel to the resistor arrangement comprising the first and the second resistor through the regulator when the second voltage drop across the second resistor exceeds a limit.

23. The circuit according to claim 21, wherein the regulator is configured to limit the bias voltage based on a voltage at a middle node of the resistor arrangement that operates as a voltage divider, wherein the voltage divider comprises the first resistor and the second resistor, wherein a divider based voltage drop across the voltage divider provides the bias voltage, and wherein the divider-based voltage drop across the voltage divider is influenced by an output signal of the controlled source.

24. The circuit according to claim 17, wherein the controlled source is configured to receive the optical control signal based on an electrical control signal and to provide an output signal of the controlled source based on the optical control signal, wherein the output signal of the controlled source is electrically isolated from the electrical control signal.

25. The circuit according to claim 17, wherein the controlled source is configured to receive the optical control signal which is based on a pulse width-modulated electrical control signal.

26. A method for trimming a bias voltage comprising:
providing a controlled source;
controlling the controlled source via an optical signal; and
changing a voltage drop across a first resistor coupled in parallel to the controlled source to trim the bias voltage for an amplifying device using the controlled source based on a measurement of a characteristic of an output signal of the amplifying device during operation of the amplifying device.

* * * * *